United States Patent
Sutardja

(10) Patent No.: US 9,324,621 B1
(45) Date of Patent: Apr. 26, 2016

(54) PROVIDING SHALLOW TRENCH ISOLATION STRUCTURES THROUGH A BACKSIDE OF A METAL-OXIDE SEMICONDUCTOR DEVICE

(71) Applicant: Marvell International Ltd., Hamilton (BM)

(72) Inventor: Sehat Sutardja, Los Altos Hills, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/703,356

(22) Filed: May 4, 2015

Related U.S. Application Data

(60) Provisional application No. 62/000,661, filed on May 20, 2014.

(51) Int. Cl.
*H01L 21/336* (2006.01)
*H01L 21/8234* (2006.01)
*H01L 21/762* (2006.01)
*H01L 21/304* (2006.01)
*H01L 21/265* (2006.01)
*H01L 27/088* (2006.01)
*H01L 29/06* (2006.01)

(52) U.S. Cl.
CPC .. *H01L 21/823481* (2013.01); *H01L 21/26513* (2013.01); *H01L 21/304* (2013.01); *H01L 21/76224* (2013.01); *H01L 27/088* (2013.01); *H01L 29/0653* (2013.01)

(58) Field of Classification Search
CPC ............... H01L 21/823481; H01L 21/26513; H01L 21/304; H01L 21/76224; H01L 27/088; H01L 29/0653
USPC ........................................ 257/368; 438/297
See application file for complete search history.

(56) References Cited

U.S. PATENT DOCUMENTS

| 2002/0110989 A1* | 8/2002 | Yamaguchi | H01L 27/1203 438/311 |
| 2005/0121710 A1* | 6/2005 | Shino | H01L 21/84 257/296 |
| 2007/0040235 A1* | 2/2007 | Chan | H01L 21/76229 257/510 |
| 2009/0045482 A1* | 2/2009 | Liaw | H01L 21/823878 257/510 |

* cited by examiner

Primary Examiner — Trung Q Dang

(57) ABSTRACT

Embodiments of the present disclosure provide a method of making a metal-oxide semiconductor (MOS) device. The method comprises providing an apparatus that comprises a common source and drain well disposed within a substrate, and a gate disposed on the substrate, wherein the gate is substantially encapsulated within layers of the apparatus. The method further comprises removing a portion of the substrate and creating a shallow trench isolation (STI) structure through the substrate such that the STI structure engages the common source and drain well.

12 Claims, 5 Drawing Sheets

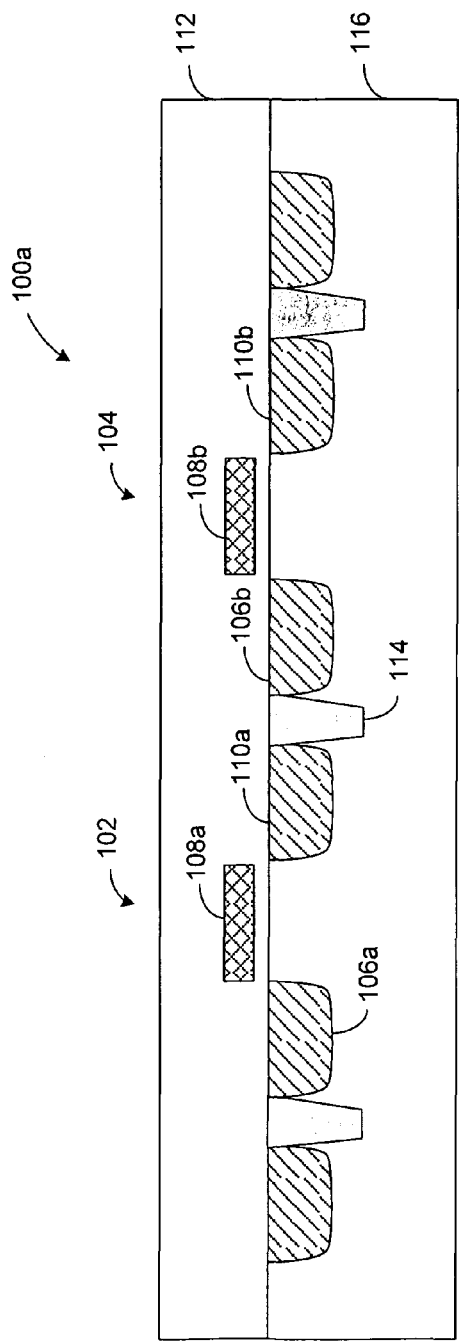
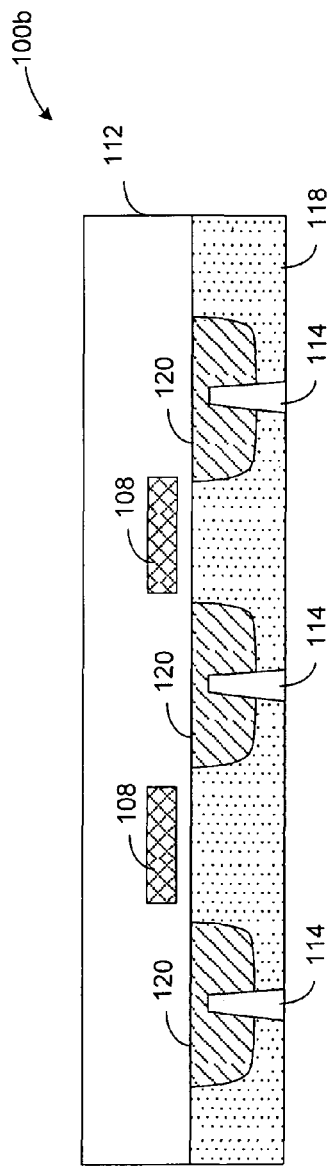
Fig. 1A
Prior Art
Fig. 1B

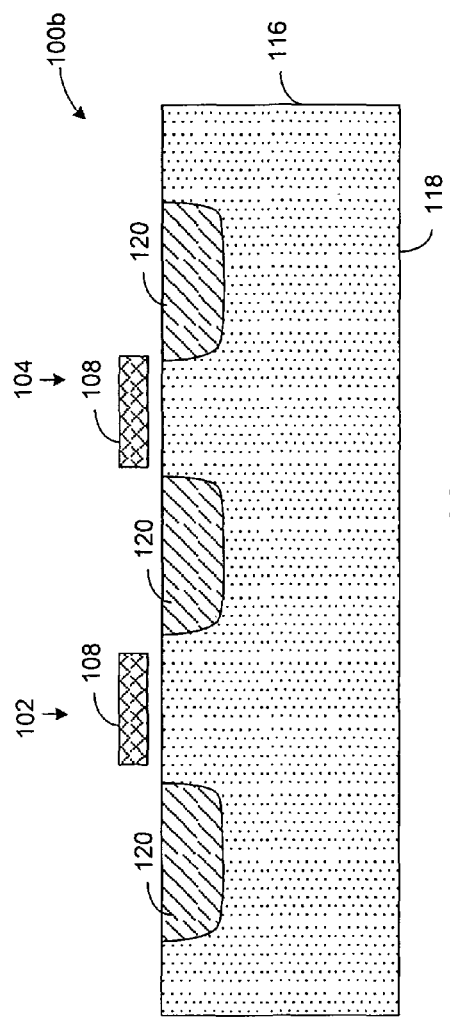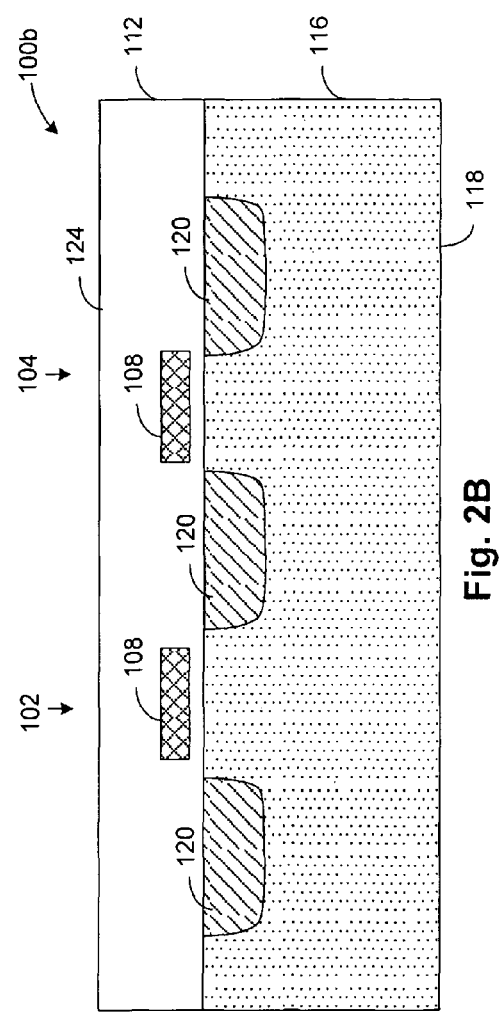

PROVIDING SHALLOW TRENCH ISOLATION STRUCTURES THROUGH A BACKSIDE OF A METAL-OXIDE SEMICONDUCTOR DEVICE

CROSS REFERENCE TO RELATED APPLICATIONS

This claims priority to U.S. Provisional Patent Application No. 62/000,661, filed May 20, 2014, the entire specification of which is hereby incorporated by reference in its entirety.

TECHNICAL FIELD

Embodiments of the present disclosure relate to semiconductor devices, and more particularly, to metal-oxide semiconductor devices that include shallow trench isolation (STI) structures.

BACKGROUND

Electrical components, such as metal-oxide semiconductor (MOS) devices, for electronic devices are becoming increasingly smaller. Much of the desire to have smaller electrical components arises from the smaller sizes of the electronic devices themselves. Decreasing the size of arrays of transistors can lead to smaller electrical components while allowing for larger arrays of transistors within such electrical components.

SUMMARY

In various embodiments, the present disclosure provides a method of making a metal-oxide semiconductor (MOS) device. The method comprises providing an apparatus that comprises a common source and drain well disposed within a substrate, and a gate disposed on the substrate, wherein the gate is substantially encapsulated within layers of the apparatus. The method further comprises removing a portion of the substrate and creating a shallow trench isolation (STI) structure through the substrate such that the STI structure engages the common source and drain well.

In accordance with an embodiment, the method further comprises prior to removing the portion of the substrate, coupling the apparatus to a carrier wafer by coupling a surface of the layers to the carrier wafer and subsequent to creating the STI structure, removing the carrier wafer.

In accordance with a further embodiment, the method further comprises prior to removing the carrier wafer, implanting the substrate with a dopant.

In accordance with embodiments, the MOS device comprises a NMOS device and implanting the substrate comprises implanting the substrate with p-type dopant.

In accordance with other embodiments, the MOS device comprises a PMOS device and implanting the substrate comprises implanting the substrate with n-type dopant.

In accordance with an embodiment, the method further comprises removing a portion of the substrate comprises grinding the substrate.

In accordance with embodiments, creating the STI structure through the substrate comprises drilling an opening through the substrate and into the common source and drain well and filling the opening with oxide.

In accordance with embodiments, the apparatus comprises a plurality of common source and drain wells disposed within the substrate and a plurality of gates disposed on the substrate, wherein the plurality of gates are substantially encapsulated within layers of the device, and creating a shallow trench isolation (STI) structure through the substrate comprises creating a plurality of STI structures through the substrate such that a corresponding STI structure of the plurality of STI structures engages a corresponding one of the plurality of common source and drain wells.

In accordance with embodiments, creating a plurality of STI structures through the substrate comprises drilling a plurality of openings through the substrate, and filling the openings with oxide.

In various embodiments, the present disclosure also provides a metal-oxide semiconductor (MOS) device comprising a common source and drain well disposed within a substrate, a gate disposed on the substrate, and a shallow trench isolation (STI) structure extending through the substrate, wherein the STI structure engages the common source and drain well.

In accordance with embodiments, the MOS device comprises a NMOS device.

In accordance with other embodiments, the MOS device comprises a PMOS device.

In accordance with embodiments, the STI structure comprises oxide.

In accordance with an embodiment, the STI structure extends from a surface of the substrate to the common source and drain well.

In accordance with embodiments, the MOS device further comprises a plurality of common source and drain wells disposed within the substrate, a plurality of gates disposed on the substrate, and a plurality of STI structures extending through the substrate, wherein a corresponding STI structure of the plurality of STI structures engages a corresponding one of the plurality of common source and drain wells.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

FIG. 1A schematically illustrates a portion of an example of a metal-oxide semiconductor (MOS) device.

FIG. 1B illustrates a portion of another example of a MOS device 100b, in accordance with various embodiments.

FIGS. 2A-2F schematically illustrate various stages of creating the MOS device illustrated in FIG. 1B, in accordance with various embodiments.

DETAILED DESCRIPTION

Figure 2C:
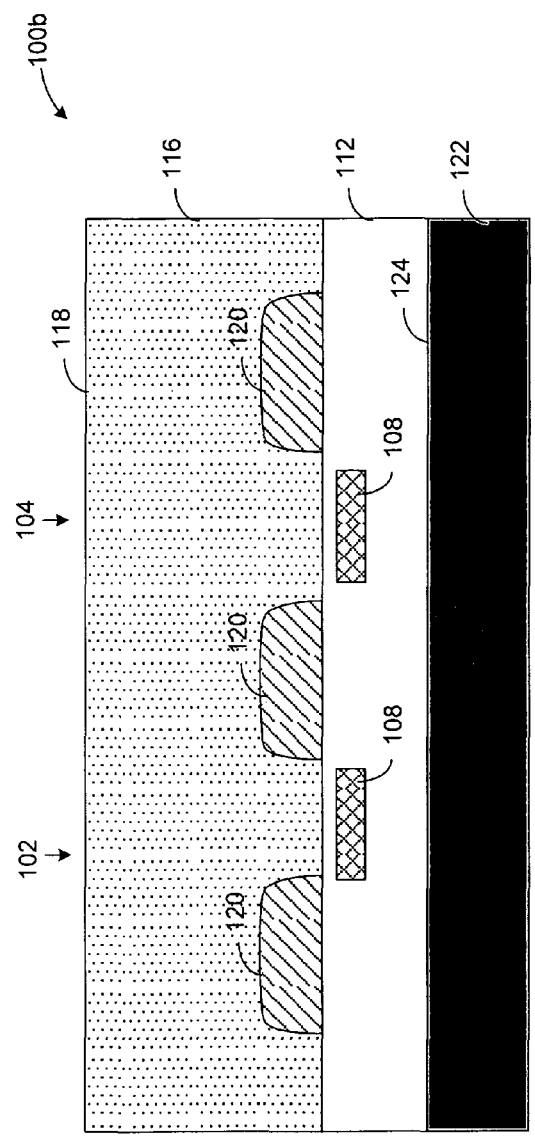

FIG. 1A schematically illustrates a portion of an example of a metal-oxide semiconductor (MOS) device 100. The MOS device 100a includes a first transistor 102 and a second transistor 104 adjacent to the first transistor 104. The first and second transistors 102, 104 each comprise a source well 106a, 106b, a gate 108a, 108b, and a drain well 110a, 110b, respectively. Generally, the gates 108 are located within other layers 112 of the MOS device 100a and are disposed on an insulating layer (not illustrated) such as, for example, an oxide layer. The first transistor 102 is separated from the second transistor 104 by a shallow trench isolation (STI)

structure 114. Generally, the MOS device 100a comprises a plurality of transistors arranged in an array and thus, the MOS device 100a includes a plurality of STI structures 114 separating the transistors. As is known, generally within arrays of transistors, the sources and drains of adjacent transistors are electrically coupled (not illustrated).

The sources 106 and drains 108, as well as the STI structure 114, are disposed within a substrate 116 generally comprising silicon, although other types of material can be used. As is known, the MOS device 100a can comprise a NMOS device in which the source and drain wells are made up of n-type material, and the substrate is made up of p-type material. In other embodiments, the MOS device 100a comprises a PMOS device in which the source and drain wells 106, 110 are made up of p-type material and the substrate is made up of n-type material.

FIG. 1B illustrates a portion of another example of a MOS device 100b. In the embodiment illustrated in FIG. 1B, the STI structures 114 extend from a bottom surface 118 of the substrate 116 into common source and drain wells 120 such that each STI structure 114 engages a corresponding common source and drain well 120. Thus, the MOS device 100b illustrated in FIG. 1B includes transistors 102, 104 that each include a common source and drain well 120 shared with an adjacent transistor within the substrate 116. The transistors 102, 104 are separated by the STI structures 114 that extend into the common source and drain wells 120.

FIGS. 2A-2F schematically illustrate various stages of creating a MOS device 100b as illustrated in FIG. 1B. In FIG. 2A, common source and drain wells 120 are created within the substrate 116, as is known in the industry. For example, the common source and drain wells 120 may comprise n-type material, i.e., the common source and drain wells 120 may be implanted with n-type dopants for a NMOS device. The gates 108 generally are disposed on an insulating layer (not illustrated). As can be seen in FIG. 2B, other layers 112 are generally created over the gates 108, as is known.

Referring to FIG. 2C, in accordance with an embodiment, the MOS device 100b is flipped or placed onto a carrier wafer 122 such that a top surface 124 of the layers 112 encapsulating the gates 108 is coupled to the carrier wafer 122. Thus, the bottom surface 118 of the substrate 116 is opposite to the carrier wafer 122.

Figure 2D:
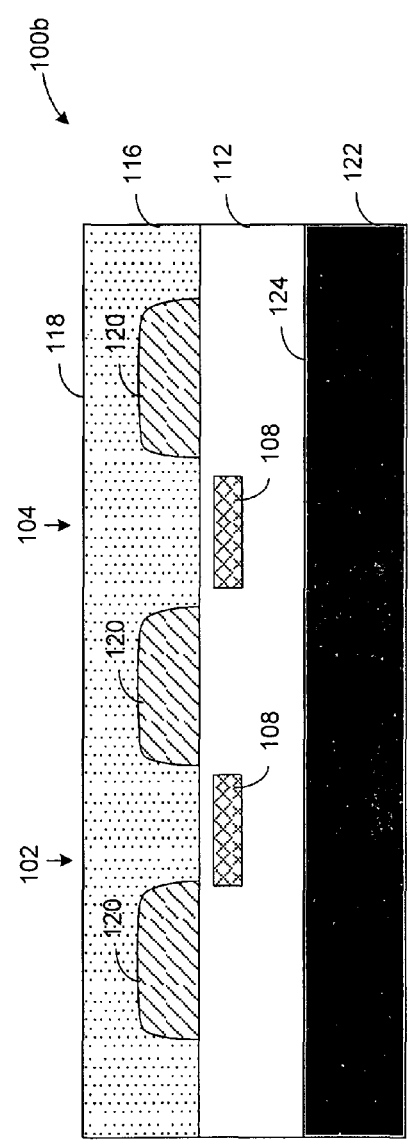

Referring to FIG. 2D, the thickness of the substrate 116 is reduced via an appropriate method such as, for example, grinding the bottom surface 118 of the substrate 116. Other methods can be used if desired. The substrate 116 is reduced to provide a fairly thin substrate 116 that includes the common source and drain wells 120. The thickness of the substrate 116 can vary depending upon the desired size of the MOS device 100b and the application for the MOS device 100b.

Figure 2E:
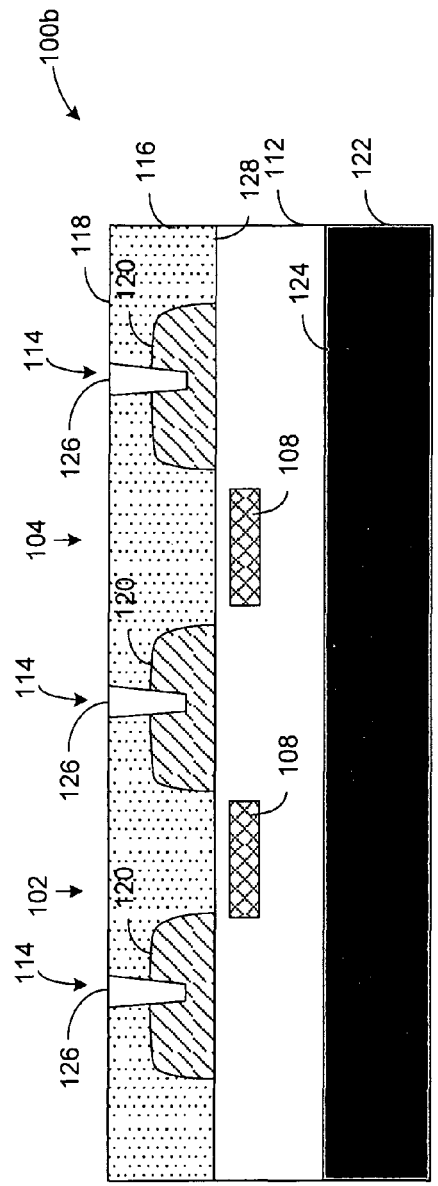

Referring to FIG. 2E, STI structures 114 are created within the MOS device 100b. The STI structures 114 can be created by drilling openings 126 from the bottom surface 118 of the substrate 116 through the substrate 116 until the openings 126 engage the common source and drain wells 120. The openings 126 can extend from the bottom surface 118 of the substrate 116 until the openings 126 simply engage the common source and drain wells 120 or, as illustrated in FIG. 2E, until the openings 126 at least partially penetrate the common source and drain wells 120. The openings 126 can extend all the way to the top surface 128 of the substrate 116 and thus all the way through the common source and drain wells 120, if desired. The openings 126 are then filled with an insulating material such as, for example, oxide, to complete the STI structures 114. Other materials may be used if desired.

Figure 2F:
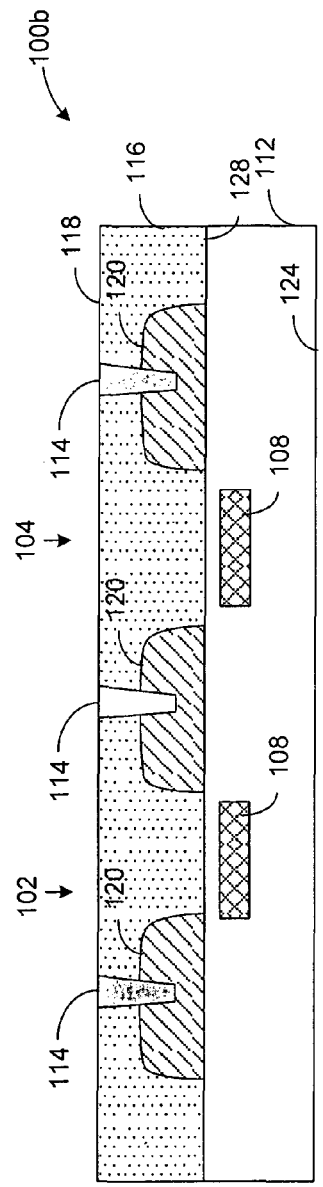

Upon completion of the formation of the STI structures 114, the carrier wafer 122 can be removed as illustrated in FIG. 2F. The MOS device 100b can then be completed in a manner as is known in the industry. For example, the substrate 116 can be implanted with p-type dopants to complete a NMOS device. Likewise, the substrate 116 can be implanted with n-type dopants to complete a PMOS device. Such implantation can occur prior to or after the removal of the carrier wafer 122. In an embodiment, the implantation occurs prior to removal of the carrier wafer 122. In such an embodiment, the carrier wafer 122 can then serve as a substrate 116 for the creation of a subsequent MOS device 100b. As previously noted, the MOS device 100b can comprise either a NMOS device or a PMOS device. Additionally, as is known, individual collector nodes (e.g., source nodes and drain nodes of the common source and drain wells 120) of adjacent transistors of the MOS device 100b are connected. This can be accomplished by, for example, depositing heavily doped N+ polysilicon or aluminum. In embodiments where aluminum is used, an N+ contact is first created on a back surface of the collector nodes.

Accordingly, with a MOS device 100b as illustrated and described with respect to FIGS. 1B and 2A-2F, more transistors can be included within the MOS device 100b since the STI structures 114 are now adjacent to the common source and drain wells 120 as opposed to between individual source wells 106 and adjacent drain wells 110, as illustrated in FIG. 1A. In general, the width of a common source and drain well 120 may be the same as or slightly larger than the width of a source well 106 and an adjacent drain well 110 (without a STI structure in between). Thus, transistors included within MOS device 100b are generally not as wide as transistors within MOS device 100a. MOS devices 100b as described herein can be used for various applications such as, for example, static random access memory (SRAM), dynamic random access memory (DRAM), flash memory, etc.

Figure 3:
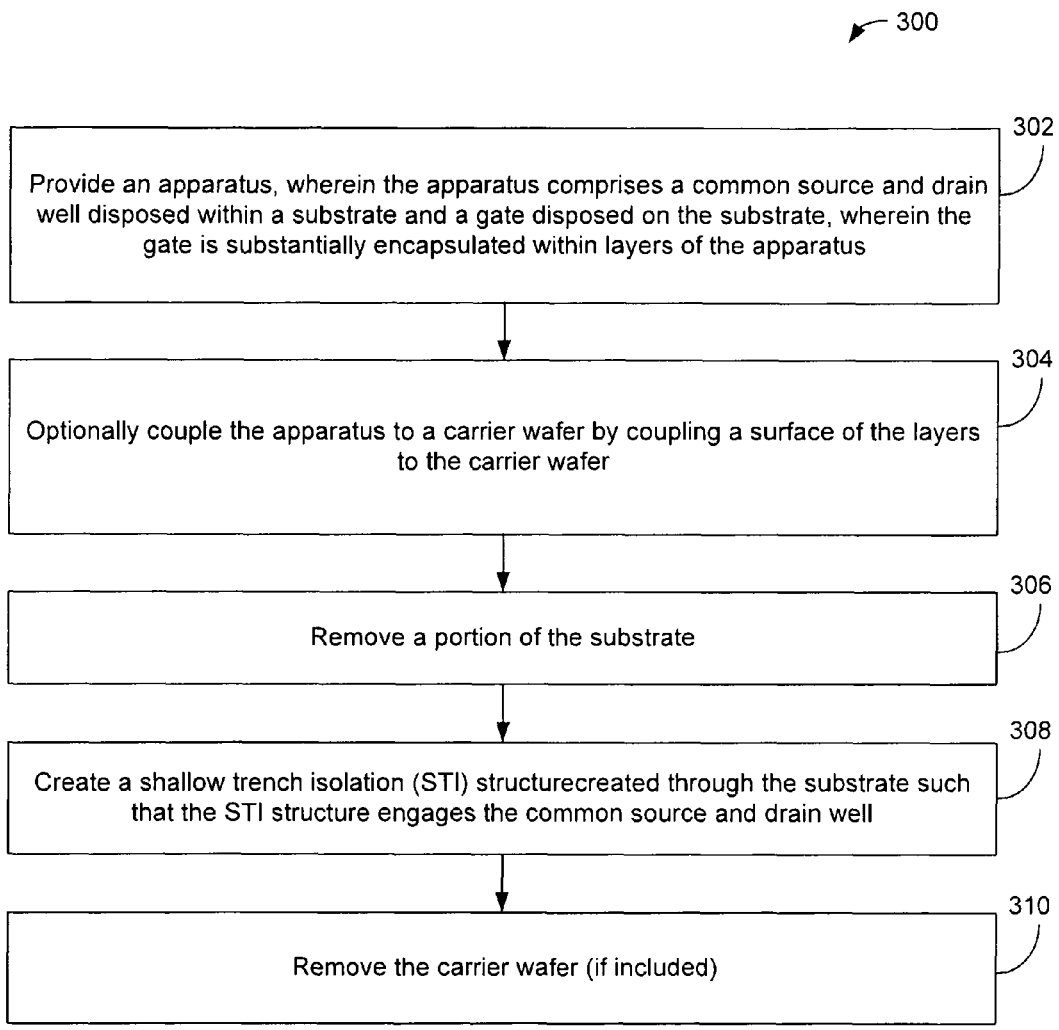
FIG. 3 is a flow diagram illustrating an example method 300 of MOS device, in accordance with various embodiments.

FIG. 3 is a flow diagram illustrating an example method 300 of making a MOS device (e.g., MOS device 100b). At 302, an apparatus is provided, wherein the apparatus comprises a common source and drain well disposed within a substrate, and a gate disposed on the substrate, wherein the gate is substantially encapsulated within layers of the apparatus. At 304, the apparatus is optionally coupled to a carrier wafer by coupling a surface of the layers to the carrier wafer. At 306, a portion of the substrate is removed. At 308, a shallow trench isolation (STI) structure is created through the substrate such that the STI structure engages the common source and drain well. At 310, the carrier wafer is removed (if included).

The description may use perspective-based descriptions such as up/down, over/under, and/or, or top/bottom. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order-dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

The terms chip, die, semiconductor die, integrated circuit, integrated circuit die, monolithic device, semiconductor device, and microelectronic device are often used interchangeably in the microelectronics field. The present invention is applicable to all of the above as they are generally understood in the field.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. A method of making a metal-oxide semiconductor (MOS) device, the method comprising:
    providing an apparatus comprising
        a common source and drain well disposed within a substrate, and
        a gate disposed on the substrate, wherein the gate is substantially encapsulated within layers of the apparatus;
    removing a portion of the substrate;
    creating a shallow trench isolation (STI) structure through the substrate such that the STI structure partially penetrates the common source and drain well but does not extend all the way through the common source and drain well;
    prior to removing the portion of the substrate, coupling the apparatus to a carrier wafer by coupling a surface of the layers to the carrier wafer; and
    subsequent to creating the STI structure, removing the carrier wafer.

2. A method of making a metal-oxide semiconductor (MOS) device, the method comprising:
    providing an apparatus comprising
        a common source and drain well disposed within a substrate, and
        a gate disposed on the substrate, wherein the gate is substantially encapsulated within layers of the apparatus;
    removing a portion of the substrate, wherein removing a portion of the substrate comprises grinding the substrate; and
    creating a shallow trench isolation (STI) structure through the substrate such that the STI structure partially penetrates the common source and drain well but does not extend all the way through the common source and drain well.

3. The method of claim 1, wherein creating the STI structure through the substrate comprises:
    drilling an opening through the substrate and into the common source and drain well; and
    filling the opening with oxide.

4. The method of claim 2, wherein:
    the apparatus comprises a plurality of common source and drain wells disposed within the substrate and a plurality of gates disposed on the substrate, wherein the plurality of gates are substantially encapsulated within layers of the device; and
    creating the STI structure through the substrate comprises creating a plurality of STI structures through the substrate such that a corresponding STI structure of the plurality of STI structures partially penetrates a corresponding one of the plurality of common source and drain wells but does not extend all the way through the corresponding one of the plurality of common source and drain wells.

5. The method of claim 4, further comprising:
    prior to removing the portion of the substrate, coupling the apparatus to a carrier wafer by coupling a surface of the layers to the carrier wafer;
    subsequent to creating the STI structure, removing the carrier wafer; and
    prior to removing the carrier wafer, implanting the substrate with a dopant.

6. The method of claim 5, wherein the MOS device comprises a NMOS device and implanting the substrate comprises implanting the substrate with p-type dopant.

7. The method of claim 5, wherein the MOS device comprises a PMOS device and implanting the substrate comprises implanting the substrate with n-type dopant.

8. The method of claim 4, wherein creating a plurality of STI structures through the substrate comprises:
    drilling a plurality of openings through the substrate; and
    filling the openings with oxide.

9. A method of making a metal-oxide semiconductor (MOS) device, the method comprising:
    providing an apparatus comprising:
        a common source and drain well disposed within a substrate; and
        a gate disposed on the substrate, wherein the gate is substantially encapsulated within layers of the apparatus;
    removing a portion of the substrate;
    creating a shallow trench isolation (STI) structure through the substrate such that the STI structure engages the common source and drain well;
    prior to removing the portion of the substrate, coupling the apparatus to a carrier wafer by coupling a surface of the layers to the carrier wafer; and
    subsequent to creating the STI structure, removing the carrier wafer.

10. The method of claim 9, further comprising prior to removing the carrier wafer, implanting the substrate with a dopant.

11. The method of claim 10, wherein the MOS device comprises a NMOS device and implanting the substrate comprises implanting the substrate with p-type dopant.

12. The method of claim 11, wherein the MOS device comprises a PMOS device and implanting the substrate comprises implanting the substrate with n-type dopant.

* * * * *